(12) United States Patent
Peng et al.

(10) Patent No.: US 8,559,187 B2
(45) Date of Patent: Oct. 15, 2013

(54) MOUNTING APPARATUS FOR EXPANSION CARD

(75) Inventors: Wen-Tang Peng, New Taipei (TW);
Guang-Yi Zhang, Shenzhen (CN);
Xiao-Zheng Li, Shenzhen (CN)

(73) Assignees: Hong Fu Jin Precision Industry (Shenzhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 188 days.

(21) Appl. No.: 13/217,263

(22) Filed: Aug. 25, 2011

(65) Prior Publication Data

US 2012/0275129 A1     Nov. 1, 2012

(30) Foreign Application Priority Data

Apr. 28, 2011   (CN) .......................... 2011 1 0108630

(51) Int. Cl.
*H05K 7/00*   (2006.01)
*H05K 7/10*   (2006.01)
*H05K 7/12*   (2006.01)

(52) U.S. Cl.
USPC ............ 361/801; 361/798; 361/802; 439/327

(58) Field of Classification Search
USPC .......... 361/801–803, 754, 791, 798; 439/327, 439/328, 59–62
See application file for complete search history.

(56) References Cited

U.S. PATENT DOCUMENTS

| | | | | |
|---|---|---|---|---|
| 5,162,979 A | * | 11/1992 | Anzelone et al. | 361/679.32 |
| 5,793,614 A | * | 8/1998 | Tollbom | 361/732 |
| 6,056,579 A | * | 5/2000 | Richards et al. | 439/358 |
| 6,816,388 B2 | * | 11/2004 | Junkins et al. | 361/801 |
| 2012/0033380 A1 | * | 2/2012 | Sun | 361/695 |
| 2012/0178276 A1 | * | 7/2012 | Lee | 439/327 |

FOREIGN PATENT DOCUMENTS

EP    474181 A1 *  3/1992  ............ H05K 7/14

* cited by examiner

*Primary Examiner* — Anatoly Vortman
*Assistant Examiner* — Jacob Crum
(74) *Attorney, Agent, or Firm* — Altis & Wispro Law Group, Inc.

(57) ABSTRACT

A mounting apparatus fixing an expansion card includes an expansion slot, two locking members connected to opposite ends of the expansion slot, for clamping the expansion card, and two latching members pivotably mounted to opposite ends of the expansion card, respectively. A latching portion protrudes from each of the latching members, for latching the corresponding locking member.

18 Claims, 5 Drawing Sheets

000
MOUNTING APPARATUS FOR EXPANSION CARD

BACKGROUND

1. Technical Field

The present disclosure relates to mounting apparatuses, and particularly, to an apparatus for mounting an expansion card.

2. Description of Related Art

An expansion card, such as a memory card, is usually fixed on a circuit board of an electronic device, such as a computer or a server, by a mounting apparatus. The mounting apparatus includes an expansion slot to electrically connect the expansion card, and two locking members disposed at two opposite ends of the expansion slot for clamping two opposite ends of the expansion card. However, the expansion slot can only mount one type of expansion cards, such as memory cards. For an expansion card of a different type, such as a solid state disk card, which is larger than the expansion cards in size, when the solid state disk card is inserted into the expansion slot, the locking members can only clamp lower portions of two opposite ends of the card. Thus, the solid state disk card cannot be securely fixed through the locking members.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
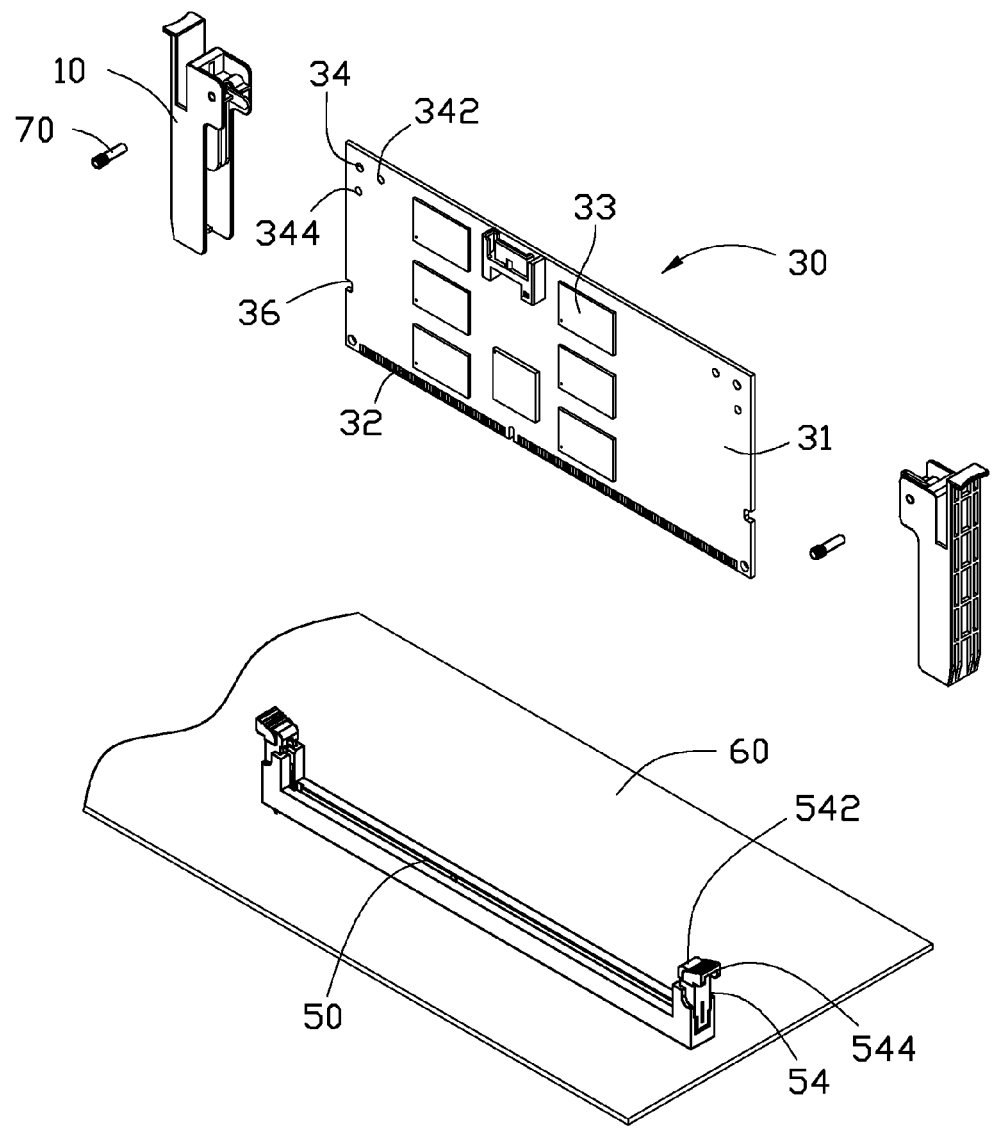
FIG. 1 is an exploded, isometric view of an exemplary embodiment of a mounting apparatus, together with an expansion card, wherein the mounting apparatus includes two latching members.

Referring to FIG. 1, an exemplary embodiment of a mounting apparatus is used for mounting an expansion card 30. The mounting apparatus includes an expansion slot 50, two locking members 54 mounted to opposite ends of the expansion slot 50, and two latching members 10 pivotably mounted to two opposite ends of the expansion card 30 through two shafts 70, respectively.

The expansion slot 50 is installed on a motherboard 60. Each locking member 54 includes a latching block 542 extending from a top of the locking member 54 toward the other locking member 54, and an operation portion 544 extending from the top of the locking member 54 away from the latching block 542.

The expansion card 30 includes an elongated circuit board 31. An edge connector 32 formed on a bottom side of the circuit board 31, and a plurality of chips 33 mounted on a side surface of the circuit board 31. Two pivot holes 34 are defined in two opposite top corners of the circuit board 31. Two locating holes 342 are defined in the top corners, respectively, between the pivot holes 34 and adjacent to the corresponding pivot hole 34. Two engaging holes 344 are defined in the top corners, respectively below the corresponding pivot holes 34. Two cutouts 36 are defined in two opposite ends of the circuit board 31. In the embodiment, the expansion card 30 is a solid state disk card.

Figure 2:
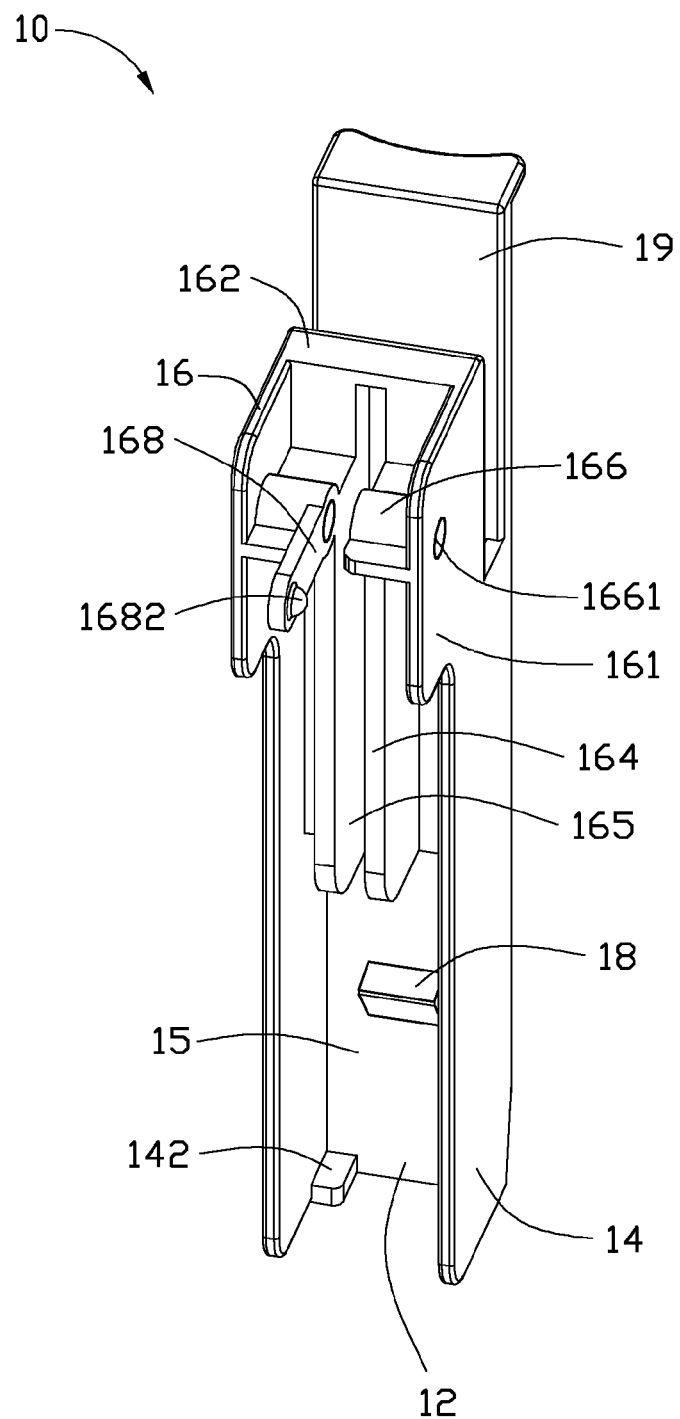
FIG. 2 is an enlarged, isometric view of the latching member of FIG. 1, but viewed from another perspective.

Referring to FIG. 2, each latching member 10 is substantially U-shaped, and includes two parallel sidewalls 14, and a connection wall 12 perpendicularly connected between corresponding sides of the sidewalls 14. The connection wall 12 and the sidewalls 14 cooperatively bound a receiving space 15. Two engaging pieces 142 extend in from the bottoms of the sidewalls 14, adjacent to the connection wall 12. A wedge-shaped latching portion 18 protrudes in from a middle of a lower portion of the connection wall 12. A substantially U-shaped installation portion 16 extends up from tops of the sidewalls 14. The installation portion 16 includes two supporting plates 161 extending up from and coplanar with the corresponding sidewalls 14, and a connecting plate 162 perpendicularly connected between corresponding sides of the supporting plates 161 and parallel to the connection wall 12. A lower end of the connecting plate 162 extends down into the receiving space 15. Two engaging plates 164 perpendicularly extend from the connecting plate 162, in the receiving space 15 and parallel to the sidewalls 14. An engaging slot 165 is defined between the engaging plates 164.

Two pivoting portions 166 are formed between tops of the engaging plates 164 and the corresponding supporting plates 161, facing each other. A shaft hole 1661 is defined in each pivoting portion 166, with two ends of the shaft hole 1661 extending through an outer side of the supporting plate 161 and the pivot portion 166, communicating with the engaging slot 165. A bar-shaped extension arm 168 extends from one of the pivoting portions 166, in the receiving space 15. A hemispherical projection 1682 protrudes from a distal end of the extension arm 168, facing the other pivoting portion 166. A substantially L-shaped operation portion 19 extends up from a top of the connection wall 12. In the embodiment, the latching member 10 is made of resilient material, such as plastic, and is integrally formed.

Figure 3:
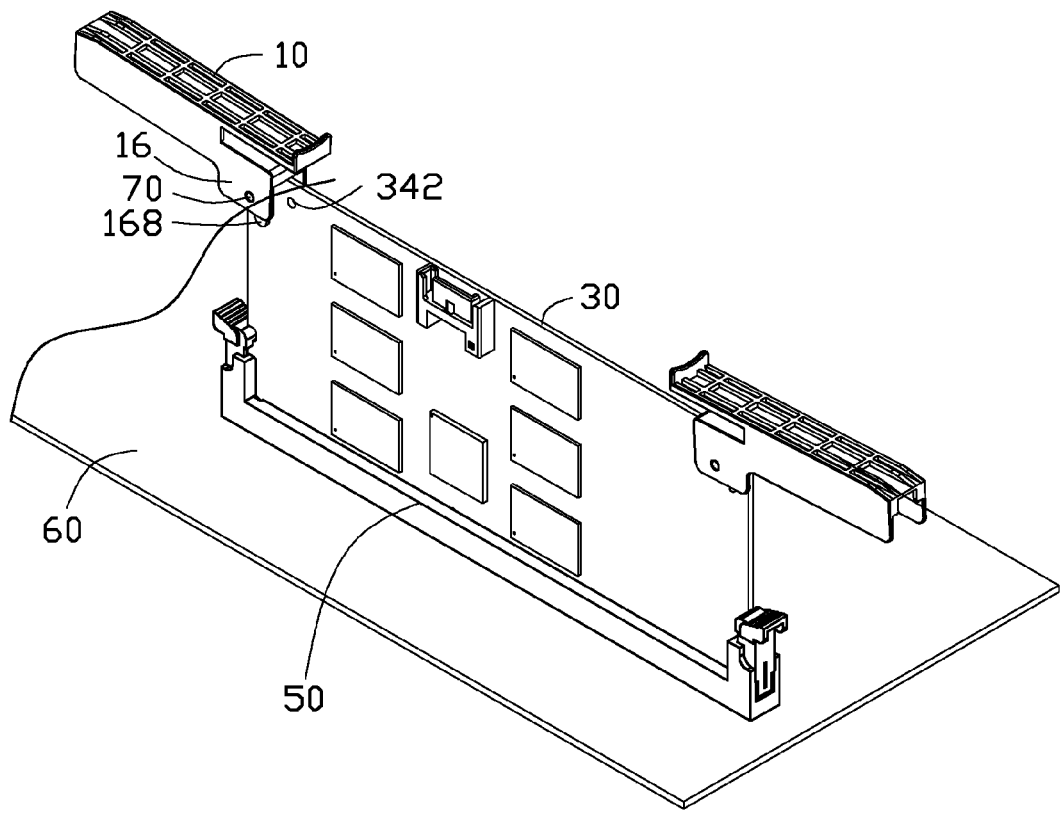
FIG. 3 is an assembled, isometric view of the mounting apparatus of FIG. 1.

Referring to FIG. 3, in assembly, each latching member 10 is attached to a corresponding end of the expansion card 30. The end of the expansion card 30 is received in the engaging slot 165. A shaft 70 extends through one of the shaft holes 1661, the corresponding pivot hole 34, and the other shaft hole 1661, to pivotably connect the latching member 10 to the expansion card 30. Before assembling the expansion card 30 to the expansion slot 50, the projections 1682 are engaged in the corresponding engaging holes 344, thereby making the latching members 10 parallel to an elongated direction of the expansion card 30.

Figure 4:
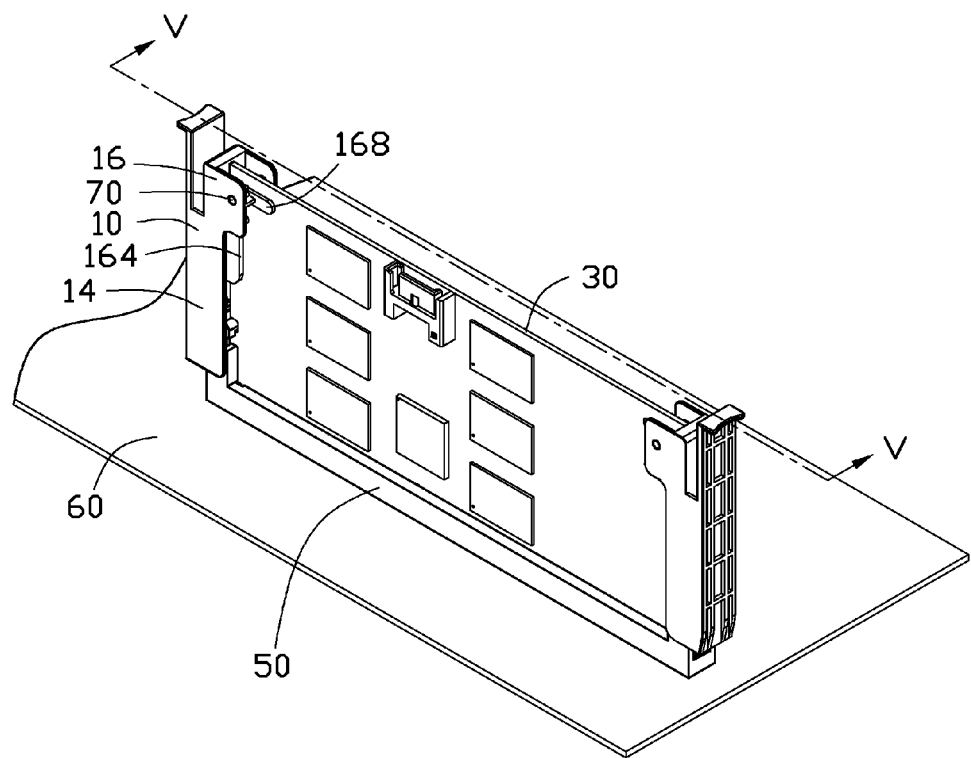
FIG. 4 is similar to FIG. 3, but shows a different state of use.
Figure 5:
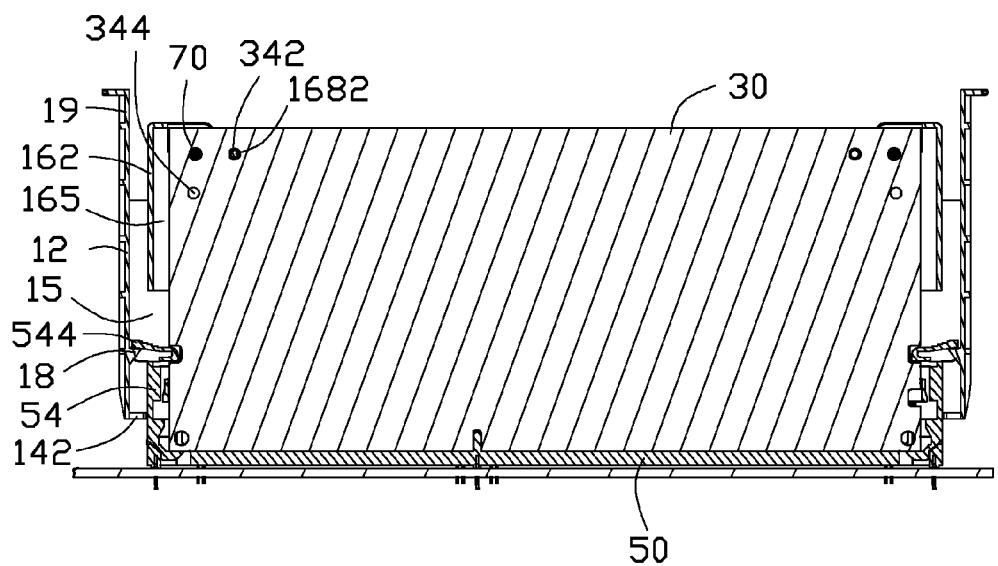
FIG. 5 is a sectional view of FIG. 4, taken along the line of V-V.

Referring to FIGS. 4 and 5, in assembling the expansion card 30 to the expansion slot 50, the locking members 54 are rotated out to make the latching blocks 542 move away from each other. The edge connector 32 is inserted into the expansion slot 50. The locking members 54 are rotated back to make the latching blocks 542 latch in the corresponding cutouts 36. The latching members 10 are rotated down, deforming the extension arms 168, thereby the projections 1682 disengage from the corresponding engaging holes 344. When the projections 1682 align with the corresponding locating holes 342, the extension arms 168 are restored to drive the projections 1682 to latch into the corresponding locating holes 342. The latching portions 18 are latched with a bottom surface of operation portion 544 of the locking member 54. The engaging pieces 142 of the latching member 10 abut against two side surfaces of the end of the expansion slot 50.

In disassembling the expansion card 30 from the expansion slot 50, the operation portions 19 of the latching members 10 are pressed in toward each other. The latching portions 18 are disengaged from the operation portions 544. The latching members 10 are rotated out, deforming the extension arm 168, thereby the projections 1682 disengage from the locating hole 342, until the projections 1682 are latched into the engaging holes 344. The operation portions 544 of the locking members 50 are rotated out. The latching blocks 542 are disengaged from the corresponding cutouts 36. The expansion card 30 is ready to be removed from the expansion slot 50.

It is to be understood, however, that even though numerous characteristics and advantages of the embodiments have been set forth in the foregoing description, together with details of the structure and function of the embodiments, the present disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A latching member for latching an expansion card to an expansion slot, the latching member comprising:
    two opposite sidewalls;
    a connection wall connected between corresponding sides of the sidewalls, wherein the connection wall and the sidewalls cooperatively bound a receiving space to receive a corresponding end of the expansion slot; and
    an installation portion extending from tops of the sidewalls, to be pivotably mounted to an upper portion of a corresponding end of the expansion card.

2. The latching member of claim 1, wherein a latching portion protrudes into the receiving space from a lower portion of the connection wall, to engage with the end of the expansion slot.

3. The latching member of claim 1, wherein two engaging pieces extend from lower portions of the sidewalls toward each other, to sandwich the end of the expansion slot.

4. The latching member of claim 1, wherein the installation portion comprises two opposite supporting plates extending up from tops of the corresponding sidewalls, two shaft holes are defined in the supporting plates, respectively, to pivotably mount the installation portion to the expansion card.

5. The latching member of claim 4, wherein the installation portion further comprises a connecting plate connected between corresponding sides of the supporting plates.

6. The latching member of claim 5, wherein two engaging plates protrude from the connecting plate in the receiving space, to sandwich the end of the expansion card.

7. The latching member of claim 6, wherein two pivoting portions are formed between tops of the supporting plates and the corresponding sidewalls, the shaft holes extend through the pivoting portions, respectively.

8. The latching member of claim 7, wherein an extension arm extends from one of the pivoting portions, a projection protrudes from a distal end of the extension arm toward the other pivoting portion, to engage with the expansion card.

9. A mounting apparatus for an expansion card, the mounting apparatus comprising:
    an expansion slot into which an edge connector of the expansion card is inserted;
    two locking members disposed at two ends of the expansion slot opposite to each other for clamping lower portions of opposite ends of the expansion card; and
    two latching members pivotably mounted to upper portions of the ends of the expansion card, which engage with the two ends of the expansion slot;
    wherein each latching member comprises two opposite sidewalls and a connection wall connected between corresponding sides of the sidewalls, the connection wall and the sidewalls cooperatively bound a receiving space to receive a corresponding one of the two ends of the expansion slot.

10. The mounting apparatus of claim 9, wherein a latching portion protrudes in the receiving space from a middle of a lower portion of the connection wall, an operation portion extends out from a top of each locking member for latching the corresponding latching portion.

11. The mounting apparatus of claim 9, wherein the latching member further comprises an installation portion formed on tops of the sidewalls, to pivotably mount the latching member to the expansion card.

12. The mounting apparatus of claim 10, wherein the installation portion comprises two supporting plates extending up from the sidewalls, respectively, two pivoting portions extend toward each other from inner sides of the supporting plates, a shaft hole is defined in each pivoting portion, two shafts pivotably extend through the shaft holes of the pivoting portions and the corresponding ends of the expansion card.

13. The mounting apparatus of claim 12, wherein a connecting plate perpendicularly connected between corresponding sides of the supporting plates, a bottom end of the connecting plate extends into the receiving space, two engaging plates perpendicularly extend from the connecting plate into the receiving space, parallel to the sidewalls, to sandwich the corresponding end of the expansion card.

14. The mounting apparatus of claim 12, wherein a resilient extension arm extends from one of the pivoting portions, a projection protrudes from a distal end of the extension arm, to detachably engage with the expansion card.

15. The mounting apparatus of claim 9, wherein two engaging pieces respectively extend in from bottoms of the sidewalls of each latching member, to sandwich the corresponding end of the expansion slot.

16. The mounting apparatus of claim 15, wherein the latching members are made of plastic.

17. An assembly comprising:
    a motherboard;
    an expansion card comprising an edge connector formed on a bottom side of the expansion card;
    an expansion slot mounted on the motherboard into which the edge connector is inserted;
    two locking members pivotably mounted to two ends of the expansion slot opposite to each other for clamping lower portions of opposite ends of the expansion card; and
    two latching members pivotably mounted to upper portions of the ends of the expansion card, which engage with the two ends of the expansion slot;
    wherein each latching member comprises two opposite sidewalls, a connection wall connected between corresponding sides of the sidewalls, and an installation portion extending up from tops of the sidewalls and pivotably mounted to the upper portion of the end of the expansion card, the connection wall and the sidewalls cooperatively bound a receiving space to receive the lower portion of a corresponding one of the two ends of the expansion slot.

18. The assembly of claim 17, wherein the upper potion of the end of the expansion card defines a pivot hole for a shaft extending through to pivotably mount the installation portion to the expansion card, a locating hole, and an engaging hole, a projection protrudes from the installation portion to engage in either the locating hole or the engaging hole;

wherein the latching member disengages from the expansion slot in response to the projection engaging in the engaging hole; and wherein the latching member engages with the lower portion of the corresponding end of the expansion slot, in response to the projection engaging in the locating hole.

\* \* \* \* \*